US006779161B1

(12) United States Patent
Poiroux et al.

(10) Patent No.: US 6,779,161 B1
(45) Date of Patent: Aug. 17, 2004

(54) PROCESS AND DEVICE FOR EVALUATING A CMOS LOGICAL CELL

(75) Inventors: Thierry Poiroux, Voreppe (FR); Phillipe Flatresse, Froges (FR)

(73) Assignees: STMicroelectronics SA, Montrouge (FR); Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 10/672,931

(22) Filed: Sep. 26, 2003

(30) Foreign Application Priority Data

Sep. 27, 2002 (FR) .......................................... 02 12022

(51) Int. Cl.[7] .............................................. G06F 17/50
(52) U.S. Cl. ............................................ 716/4; 703/13
(58) Field of Search ...................... 716/2, 4, 6; 703/13, 703/14

(56) References Cited

U.S. PATENT DOCUMENTS

| | | | | |
|---|---|---|---|---|
| 6,442,735 B1 | * | 8/2002 | Joshi et al. ..................... | 716/4 |
| 6,490,546 B1 | * | 12/2002 | Kimmel et al. ................ | 703/14 |
| 6,567,773 B1 | * | 5/2003 | Rahmat et al. ................ | 703/14 |
| 6,581,028 B1 | * | 6/2003 | Hayashi ........................ | 703/13 |
| 2003/0078763 A1 | * | 4/2003 | Chuang et al. ................ | 703/14 |

OTHER PUBLICATIONS

Shepherd, K. et al., "Body–voltage estimation in digital PD–SOI circuits and its application to static timing ananlysis", IEEE, 1999. pp. 531–538.*
Demeus, L. et al., "Comparison of charge injection in SOI and Bulk Mosanalog switches", IEEE, 1997, pp. 104–105.*
Hulfachor, R.B. et al., "Comparative analysis of hot electron injection and induced device degradation in scaled 0.1 micron SOI n–Mosfet's using monte carlo simulation", IEEE, 1996. pp. 53–55.*

Faynot et al., "Compact Analytical Modeling of SOI Partially Depleted MOSFETs with LETISOI", Solid State Electronics, Elsevier Science Publishers, Barking, Great Britain, vol. 45, No. 4, Apr. 2001, pp. 599–605 ISSN: 0038–1101.
Shepard et al., "Body–Voltage Estimation in Digital PD–SOI Circuits and its Application to Static Timing Analysis", Computer–Aided Design, 1999. Digest of Technical Papers, 1999, IEEE/ACM International Conference on San Jose, CA, USA Nov. 7–11, 1999, Piscataway, NJ, USA, IEEE, US, Nov. 7, 1999, pp. 531–538, XP010363841.
Aller et al., "Detailed Analysis of the Gate Delay Variability in Partially Depleted SOI CMOS Circuits", SOI Conference, 1999 proceedings, 1999 IEEE International Rohnert Park, CA, USA Oct. 4–7, 1999, Piscataway, NJ, USA, IEEE, US, Oct. 4, 1999, pp. 40–41, XP010370224, ISBN: 0–7803–5456–7.
Xilin et al., "SOI Device and Technology: Modeling, Characterization, and Simulations", 2001 6th International Conference on Solid–State and Integrated Circuit Technology Proceedings (CAT. No. 01EX443), Proceedings of 6th International Conference on Solid–State and IC Technology, Shanghai, China, Oct. 22–25, 2001, pp. 643–649, Voll. 1, XP010576049 2001, Piscataway, NJ, USA, IEEE, USA, ISBN: 0–7803–6520–8.

* cited by examiner

Primary Examiner—Stacy A. Whitmore
(74) Attorney, Agent, or Firm—Lisa K. Jorgenson; Allen, Dyer, Doppelt, Milbrath & Gilchrist, P.A.

(57) ABSTRACT

The process includes modeling the cell and a phase for determining internal potentials of the cell based on operational simulation of the modeled cell utilizing a periodic binary stimulation signal. The floating substrate of each transistor of the cell, at predetermined successive instants of injection, is injected with a charge proportional to the variation of the internal potential of this transistor. A variation is determined during a predetermined time interval of the stimulation signal preceding the current instant of injection and exempt from injection, to accelerate the charge or the discharge of the floating substrate of the transistor.

29 Claims, 8 Drawing Sheets

PROCESS AND DEVICE FOR EVALUATING A CMOS LOGICAL CELL

FIELD OF THE INVENTION

The present invention relates to the field of CMOS logical circuits manufactured in partially depleted silicon-on-insulator technology (PD-SOI: Partially Depleted Silicon-on-Insulator), and more particularly, to the evaluation or characterization of these circuits, in terms of time delay, for example.

BACKGROUND OF THE INVENTION

In recent years SOI technology (Silicon On Insulator) has proven to be a particularly interesting alternative to classic CMOS technology carried out on solid silicon. More particularly, the so-called effects of "floating substrate", well known to the skilled artisan, and the reduction in joining capacities are the main causes of improved performances contributed by this SOI technology. On the contrary, the floating substrate does have disadvantages.

One such disadvantage is the effect of hysteresis of the threshold voltage of a transistor, which is translated by variations in time delay, that is, variations in the propagation time of a signal between the input and the output of a logical cell incorporating such transistors, for example an inverter. Partially depleted silicon-on-insulator technology introduces a "time" dependence of delays, such that the same structure can have different delays from cycle to cycle when it is rated by a clock signal. A method for initializing the voltage of the floating substrate is generally used in the design of SOI circuits and error tolerances are utilized to take these time constraints into account. However, such an approach can lead to overestimating or underestimating the performance of the structure.

Furthermore, not only delays in worst-case scenarios but also delays in best-case scenarios must be known, especially for problems of synchronization into account. However, both the worst cases and the best cases are difficult to identify since the parameters of design process such as current gain, input slope, charge, feed and temperature, play a key role. And, the variable nature of the threshold voltages in PD-SOI technologies is such that propagation of a given transition between the input and output of a logical cell leads to a different delay according to what is found in static balance conditions (DC) or else if a state of dynamic equilibrium (AC "steady state") has been attained. And, it may prove impossible in practice to characterize a logical cell by exhaustive simulations since several thousand cycles, thus several hours of simulation, are necessary to reach dynamic equilibrium even for simple inverter-type cells. The characterization of a much more complex cell cannot be done with such an approach.

SUMMARY OF THE INVENTION

An object of the invention is to provide a method and device for rapid evaluation of time delays of a logic cell in the dynamic equilibrium state, as well as rapid evaluation of delays in best-case and worst-case scenarios, even for complex cells.

The invention therefore provides a process for evaluating/characterizing a logical CMOS cell to be produced in partially depleted silicon-on-insulator technology. This process comprises modeling the cell, for example by using a transistor model of type BSIM3SOI, and a phase for determining internal potentials (or potentials of floating substrates) of the transistors of the cell. This determination phase is based on operational simulation of the modeled cell utilizing a binary stimulation signal. In this determination phase, the floating substrate of each transistor and the cell, and at predetermined successive instants of injection, is injected with a charge proportional to the variation of the internal potential of this transistor, a variation determined during a predetermined time interval of the stimulation signal preceding the current instant of injection and exempt from injection, so as to accelerate the charge or the discharge of the floating substrate of the transistor. The charge is injected for example by injecting a current. Of course, the injected charge can be positive or negative, allowing the floating substrate of a transistor to be discharged or charged.

According to an embodiment of the invention, the injection current is determined such that, after injection, the variation in internal potential of the transistor in question reaches n times the measured variation of the internal potential. The value of n is determined for example from measuring the variation of the internal potential of a transistor of the cell, for example during a first cycle of the stimulation signal, and from the estimated amplitude of the variation of the internal potential of this transistor between its state of static equilibrium and its state of dynamic equilibrium.

According to an embodiment of the invention, in which the stimulation signal comprises a transition separating two plateaus in each period, an injection instant is generally found at a point where the internal potential of the transistor is relatively stable. By way of example, an injection instant can be located during a plateau and at a transition distance. The injection duration of the current is then advantageously selected greater than the time pitch of the operational simulation and less than the duration of a plateau.

According to an embodiment of the invention, two consecutive injection instants can be spaced by a duration equal to two periods of the stimulation signal. The time interval then has a duration equal to a period of the stimulation signal. In such a variation, the cell thus sees the equivalent of 1+n impulses of the stimulation signal over the course of two simulation periods, resulting in an acceleration factor equal to $(1+n)/2$.

To ensure that the predetermined time interval, during which the variation of the internal potential of the transistor will be calculated, is exempt from injection, an instant which precedes the injection instant of 1.5 periods of the stimulation signal can be taken as the initial instant of the time interval. In addition, the final instant of this time interval can be taken as being the instant preceding the injection instant of 0.5 period of the stimulation signal.

According to an embodiment of the invention, for operational simulation, each transistor of the cell is replaced by a model of this transistor linked to three modeled voltage-controlled voltage sources, enabling determination of an internal potential target of the transistor to be reached after injection. Also, the transistor is likewise linked to a modeled current source supplying the injection current proportional to the difference between the internal potential target and the internal potential at the injection instant.

Thus, for example, the first source of voltage supplied at the injection instant, the value of the internal potential of the transistor delayed by a period of the stimulation signal. The second source of voltage supplies the variation of internal potential over a period, delayed by a half-period of the stimulation signal. And the third source voltage supplies the internal potential target.

The invention thus determines, for example, evolution of the internal potentials of the transistors of the cell but also the evolution of the time delays, or again evolution of other characterization parameters such as consumption or fault current, from the state of static equilibrium to the dynamic equilibrium state, relative to the rising and falling transitions of the stimulation signal, and for the two initial values of the stimulation signal. From this can be deduced the worst cases or the best cases for these parameters. This direct determination, in particular of the worst cases of time delays, constitutes a considerable advantage of the method.

An object of the invention is also a device for characterizing a CMOS logical cell being created in a partially depleted silicon-on-insulator technology. This device includes means/unit for modeling the cell and processing means/unit suitable for effecting a determination phase of the internal potentials of the cell based on operational simulation of the modeled cell utilizing a periodic binary stimulation signal. In this determination phase the processing means are suitable for injecting into the floating substrate of each transistor of the cell, and at predetermined successive injection instants, a charge proportional to the variation of the internal potential of this transistor determined during a predetermined time interval of a stimulation signal preceding the current injection instant and exempt from injection, to accelerate the charge or discharge of the floating substrate of a transistor.

According to an embodiment of the invention, the processing means determine the injection current such that after injection the variation in internal potential of the transistor in question reaches n times the measured variation of the internal potential. According to an embodiment of the invention, the processing means determine the value of n from measuring the variation of the internal potential of a transistor of the cell and an estimated amplitude of the variation of the internal potential of this transistor between its state of static equilibrium and its state of dynamic equilibrium.

According to an embodiment of the invention, the modeling means comprise for each transistor of the cell a model of this transistor linked to three modeled sources of voltage controlled in voltage, allowing an internal potential target of the transistor to be reached after injection to be determined, and to a modeled source of current supplying the injection current proportional to the difference between the internal potential target and the internal potential at the instant of injection.

The processing means are also advantageously suitable for determining the evolution of the internal potentials of the transistors of the cell from the static equilibrium state to the dynamic equilibrium state, relative to the rising and falling transitions of the stimulation signal and for the two initial values of the stimulation signal, and are suitable for deducing the internal potentials of the transistors corresponding to the worst case or best case of the time delay of the cell.

The processing means can also be suitable for determining the evolution of the different time delays of the cell, and for determining the time delay corresponding to the worst case or the best case. The processing means can also be suitable for determining the evolution of other characterization parameters of the cell.

BRIEF DESCRIPTION OF THE DRAWINGS

Other advantages and characteristics of the invention will emerge from an examination of the detailed description of the non-limiting embodiment and attached diagrams, in which.

DETAILED DESCRIPTION OF THE PREFERRED EMBODIMENTS

Figure 1:
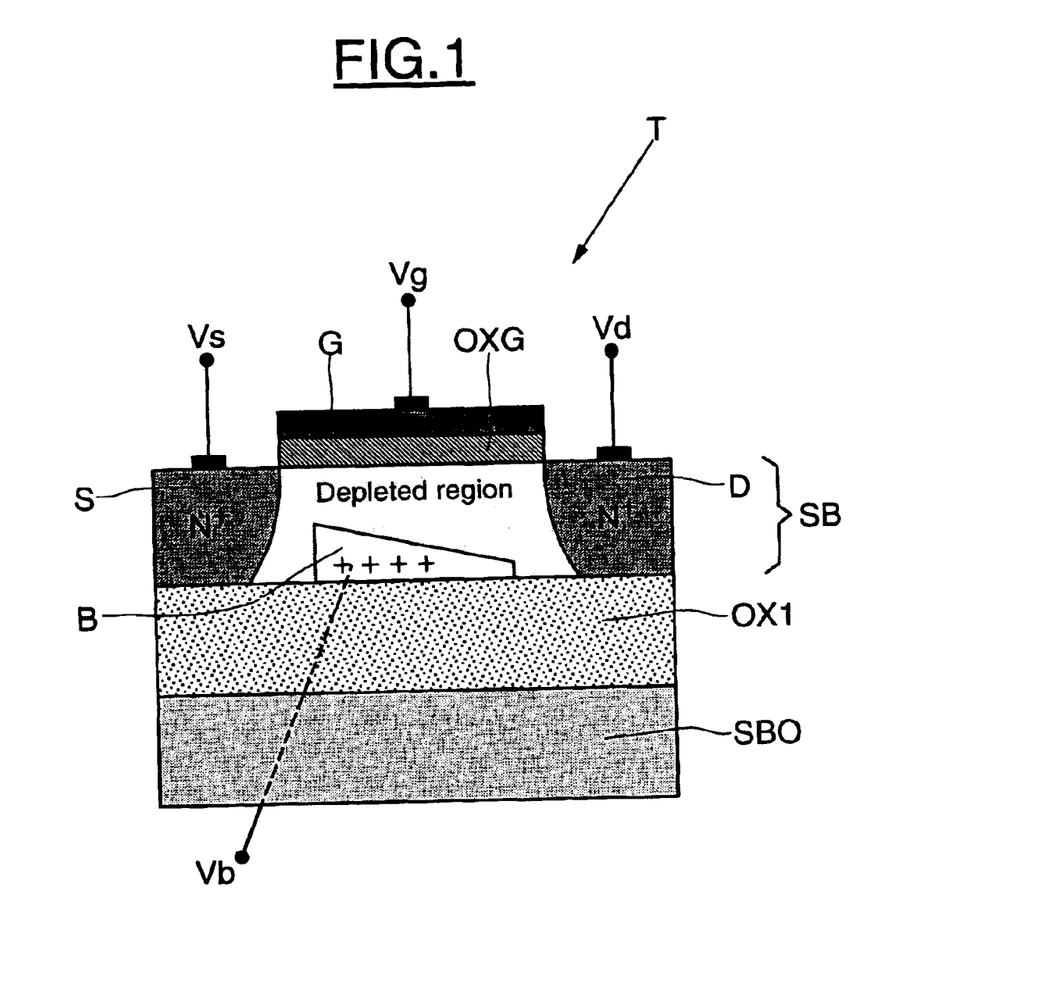
FIG. 1 is a schematic cross-sectional view illustrating a transistor made by partially depleted silicon-on-insulator technology.

In FIG. 1 the reference T designates an NMOS transistor made on a SB silicon substrate resting on an OX1 insulating layer. This OX1 insulating layer itself rests on an SBO carrier substrate. This structure is typical of a so-called SOI structure well known to those skilled in the art. When the thickness of the SB substrate is sufficiently significant, for example typically greater than 50 nanometers, the SB substrate is of the partially depleted type.

In such a transistor, there is a neutral zone B located under the depleted region and between the source and drain regions. This neutral zone, which will collect holes, is not connected to a fixed potential. This then becomes a floating substrate zone. Of course, apart from this floating substrate zone, the transistor conventionally comprises source zone S, drain D and gate G which is insulated from the SB substrate by an OXG gate oxide.

The variations of the internal potential Vb of the transistor T, that is, the potential of the floating substrate B, are caused especially by the capacitive coupling of source/gate/drain as well as by impact ionization, generation/recombination effects and grid tunnel effects. These variations of internal potentials especially result in variations of the threshold voltage and variations of fault currents and saturation of the transistor.

Moreover, the structures in partially depleted SOI technology have historical effects which translate in particular by time dependence of delays. More precisely, the recent history of an input terminal has an impact on performance. This is illustrated in particular in FIG. 2 in the case of an inverter IV having an input A and an output Z.

Figure 2:
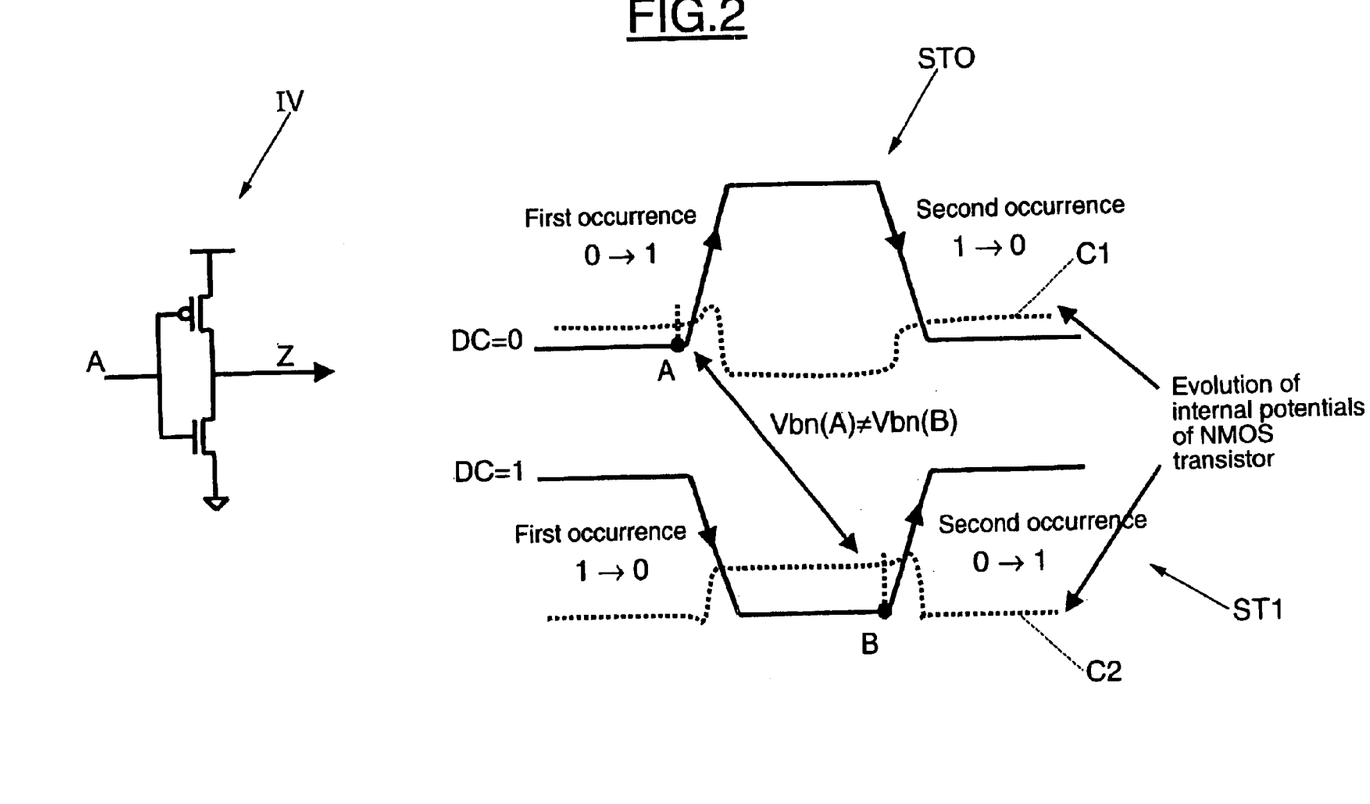
FIG. 2 is a schematic diagram illustrating the evolution of the internal potentials of an NMOS transistor of an inverter after one, then two transitions of two stimulation signals respectively having two different initial logic values.

In this figure, the curve C1 illustrates the evolution of the internal potential of the NMOS transistor of the inverter in response to a binary stimulation signal ST0 having the logical value 0 as its initial value. The curve C2 illustrates the same evolution of the internal potential of the NMOS transistor of the inverter in response to a stimulation signal ST1 having the logical value 1 as its initial value.

To observe the first occurrence of the transition 0/1, and the second occurrence of the transition 0/1, it is necessary to use the two stimulation signals ST0 and ST1. The same applies for observing the first occurrence of the transition 1/0 and the second occurrence of the transition 1/0. It is observed at the output Z, in SOI technology, as is solid silicon technology, that the rising times are different to the falling times. However, in SOI technology, the first occurrence and the second occurrence of the same transition do not result in the same internal potentials and consequently do not present the same time delays. This is due to the variations in potential of the neutral zone B which has different values according to whether it is in a state of static equilibrium (situation A) or whether it has undergone recent transition and whether it has had time to regain a state of equilibrium (situation B).

The dynamic equilibrium ("steady state") may be defined as the point of operation where the internal potential of the transistors no longer varies between two successive transitions of the stimulation signal, that is, where the variation in charge is zero in the neutral zone B. In this state the charges entering the neutral zone (via the fault current of the inversely polarized neutral junction zone/drain, via an impact ionization phenomenon, and via the grid tunnel current) are equal to the charges exiting via the junction of neutral zone/source, now conductive.

Figure 3:
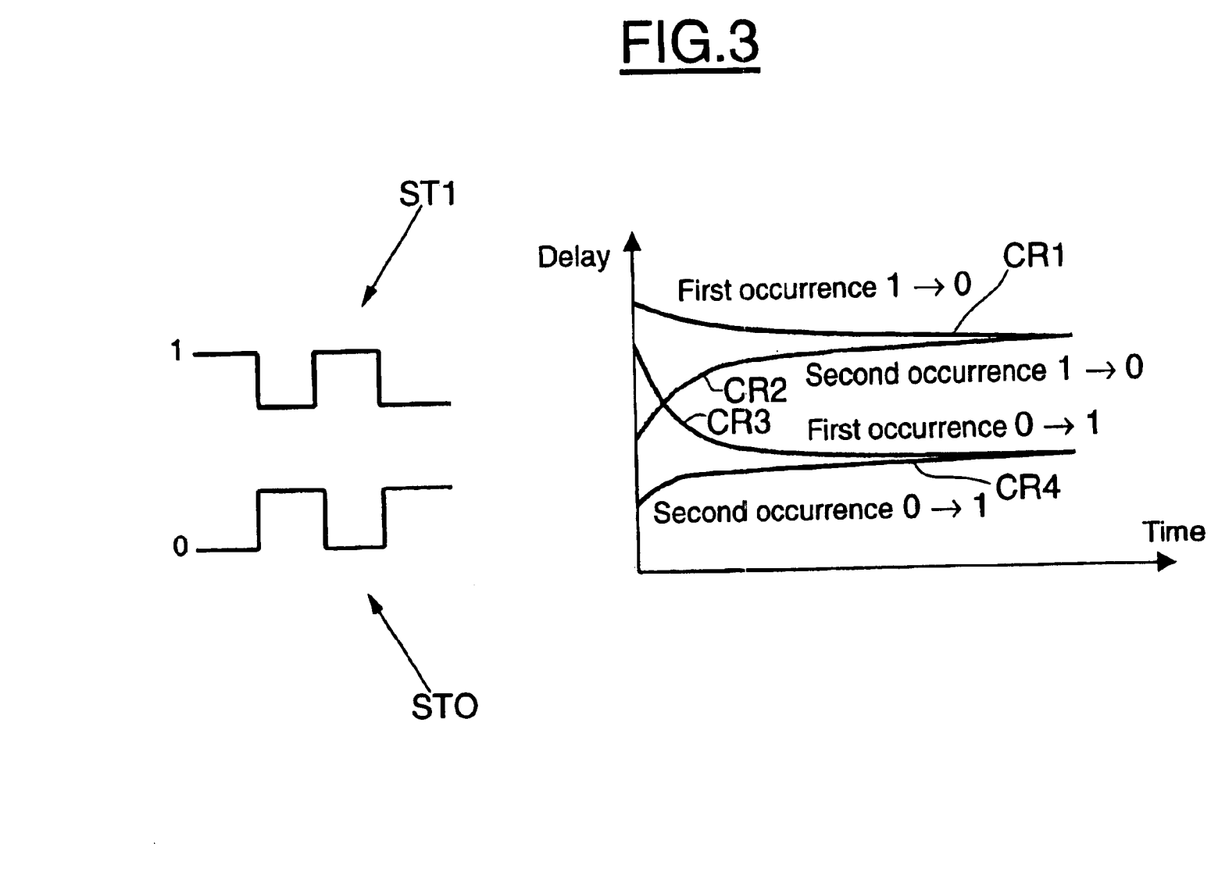
FIG. 3 is a schematic diagram illustrating time evolution curves of delays.

If a large number of pulses is sent to the on input of a logical cell, for example an inverter, by using the stimulation signal ST1 which starts off from the logical condition 1, then the stimulation signal ST0 which starts from the logical condition 0, it is noticed (FIG. 3) that the delays correspond to the first and second occurrences of the same transition converge (curve CR1 and CR2 on one hand and CR3 and CR4 on the other). Two different states of dynamic equilibrium for the two stimulation signals are obtained, that is, for the different initial logical values. Similarly, the four time delays corresponding respectively to the first and second occurrences of the transition 1/0 and to the first and second occurrences of the transition 0/1, are different.

Figure 4:
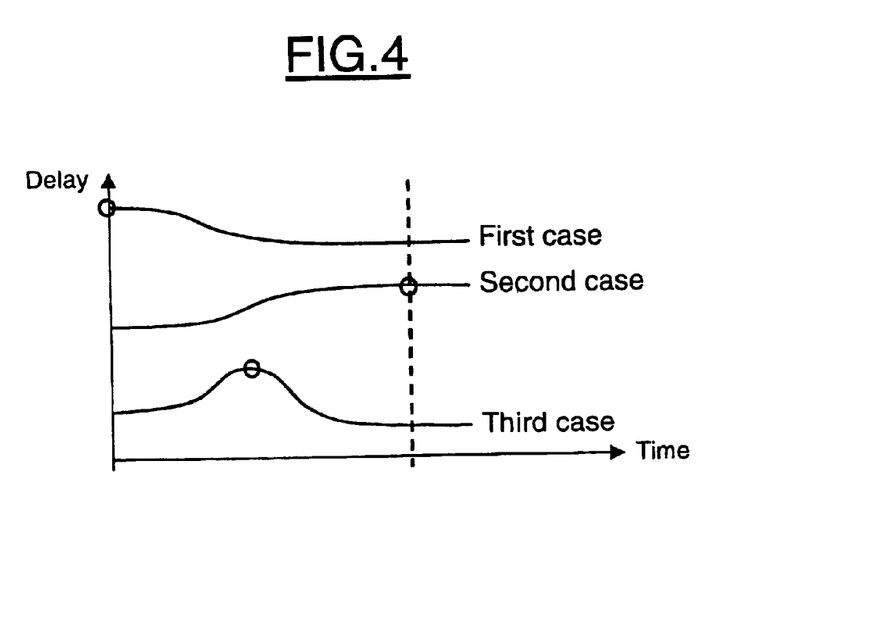
FIG. 4 is a diagram illustrating three possible time evolutions of propagation delays in a logical cell.

It is thus advisable to determine them, in the same way as the time delays corresponding to the two states of dynamic equilibrium, so as to be able to determine the time delay in the worst and best case scenarios. In fact, in partially depleted SOI technology, the worst-case (or best-case) time delay can be, as shown in FIG. 4, for a given stimulation signal (that is, having a given initial logical value), during the first occurrence of a transition (first case) or else in the state of dynamic equilibrium (second case) or else anywhere between the two (third case). In theory, the dynamic equilibrium state is attained after several hundred thousand pulses on the input of the door in question, representing a simulation time of the order of several hours for a simple inverter and is consequently impossible to simulate for a more complex cell.

Figure 5:
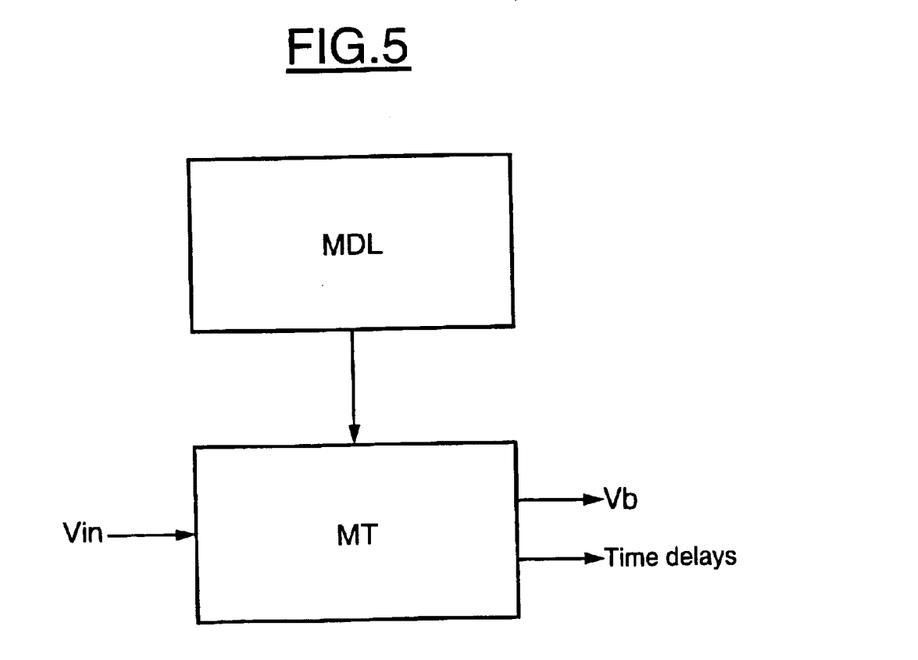
FIG. 5 is a schematic block diagram illustrating an embodiment of a device according to the present invention.

The invention effectively resolves this problem and in particular very rapidly determines the internal potentials of the transistors of a logical cell in their state of dynamic equilibrium. In this respect, MDL modeling means/unit of the cell are provided for characterizing a logical cell, for example utilizing a transistor model of the partially depleted BSIM3SOI type, available through the Internet site of the University of Berkeley (USA) or else a model of the type SOISPICE, available from the University of Florida (USA), and MT processing means/unit (FIG. 5) suitable for effecting a determination phase of the internal potentials Vb of the transistors of the cell.

In general, in the determination phase of these internal potentials the floating substrate of each transistor of the cell, and at predetermined successive instants of injection, is injected with a charge proportional to the variation of the internal potential of this transistor determined over the course of the predetermined time interval of the stimulation signal preceding the current injection instant or exempt from injection, so as to accelerate the charge or discharge of the floating substrate of the transistor.

Figure 6:
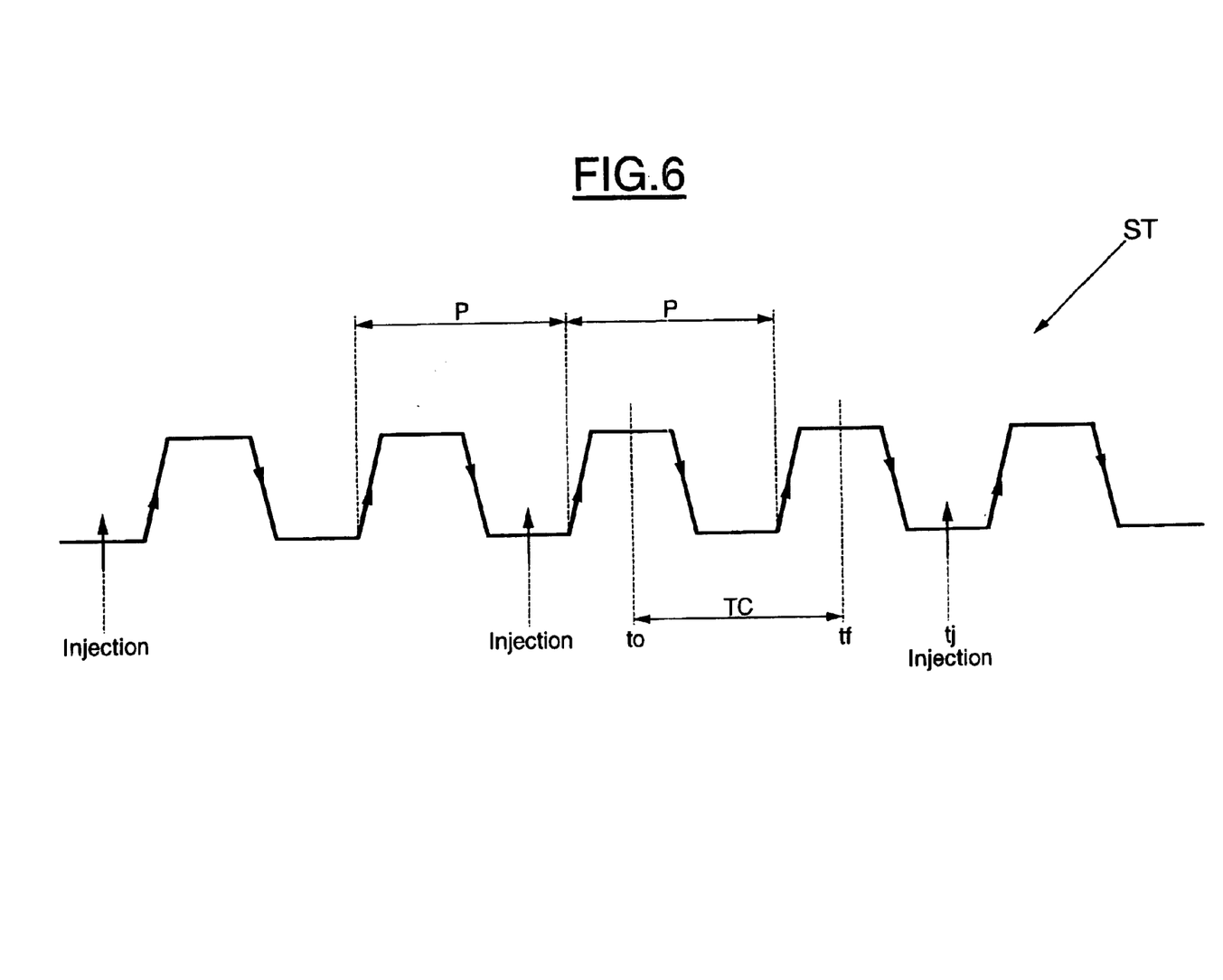
FIGS. 6 to 9 are diagrams showing different curves illustrating an embodiment of the process according to the present invention.

In FIG. 6 the stimulation signal ST (or Vin) is a periodic binary signal of period P successively taking the values 0 and 1. In this embodiment the instants of injection of the current tj are separated by an interval equal to two periods of the stimulation signal. Furthermore, each injection instant happens during a plateau of the stimulation signal ST, for example substantially in the middle of the low plateau. The calculation time interval TC of the variation of an internal potential of each transistor of the cell must not contain any injection instant. As a consequence, in the example illustrated in FIG. 6, the time interval TC starts at the initial instant t0 preceding the injection instant tj of the three half-periods P of the stimulation signal.

This interval TC terminates at the instant tf preceding the injection instant of a half-period of the stimulation signal. In other words, in the example illustrated here, during a first interval of the input signal ST, the variation of the potential of the floating substrate of each transistor is evaluated. During the following interval, a current is injected into the floating substrates of the transistors until their variation in potential reaches n times the calculated variation of internal potential. Therefore, the circuit sees the equivalent of $(1+n)$ pulses of the stimulation signal during a period equal to two periods of the stimulation signal, resulting in an acceleration factor equal to $(1+n)/2$. This process is autoconverging since the variation of the internal potential in the state of dynamic equilibrium is zero.

An embodiment of the process includes replacing each transistor of the logical cell by a sub-circuit containing a transistor model, for example a BSIM3 model, linked to three modeled voltage-controlled voltage sources and to a modeled voltage-controlled source of current. The first source of current supplies the internal potential of the transistor delayed by a period P of the stimulation signal: (formula I below):

$$Vb'(t)=Vb(t-P) \quad \quad (I)$$

The second source of voltage supplies the variation of an internal potential of the transistor over a period, and delayed by a half-period (formula II below)

$$\Delta Vb(t)=Vb(t-P/2)-Vb'(t-P/2)=Vb(t-P/2)-Vb(t-3P/2) \quad (II)$$

The third source of voltage supplies a potential target Vbc defined by the formula III below:

$$Vbc(t)=Vb'(t)+n\Delta Vb(t)=Vb(t-P)+n\Delta Vb(t) \quad \quad (III)$$

Finally, injection is carried out using a source of current supplying a current proportional to the difference between the potential target and the instant of injection and the internal potential current at the injection instant. This current Iinj at the instant t of injection is defined by the formula IV below:

$$Iinj(t)=A(Vbc(t)-Vb(t)).Vclk(t) \quad \quad (IV)$$

In this formula A is a predetermined coefficient of proportionality and Vclk is an external source of voltage common to all the transistors, having in the example described here, a period double that of the stimulation signal utilized, so as to effect injection of one pulse in two. It is thus seen that the injection current is determined such that after injection, the variation of the internal potential of the transistor in question reaches n times the measured variation of the internal potential.

From a practical point of view, the operational simulation according to the invention can be effected by software simulation means/unit utilizing for example simulation software known as Eldo and marketed by Mentor Graphics.

The value of n is determined from measuring the variation of the internal potential of a transistor of the cell during simulation over a period of the stimulation signal. The Eldo software then supplies this variation ΔVb. In addition, the estimated amplitude of the variation of the internal potential of an NMOS transistor or a PMOS transistor between its state of static equilibrium and its state dynamic equilibrium is known approximately. This amplitude is typically of the order of 100 millivolts for an NMOS transistor, and is less for a PMOS transistor.

A maximum jump admissible for the internal potential is then fixed during an injection cycle, for example 10 millivolts for an NMOS transistor and 5 millivolts for a PMOS transistor. The ratio of this maximum jump on the variation of the internal potential measured on the first cycle supplies the value of the coefficient n.

With respect to the proportionality factor A, this must be selected sufficiently high for the internal potential to reach the potential Vbc over the injection period. On the other hand, it must not be too high otherwise this will result in excessively fast injection, leading to problems of time discretisation at the simulator level. An injection which is carried out in a few picoseconds, which is far greater than the time pitch of the simulator and less than the duration of a plateau of the stimulation signal when the latter is for example that illustrated in FIG. 7, will preferably be selected.

The process coefficient A is also fixed from the operational simulation performed on the first cycle. Accordingly, apart from the variation ΔVb of the internal potential on this cycle, the simulation means also supply the charge variation ΔQb. The ratio between this charge variation and the variation of the internal potential supplies the equivalent capacity of the floating substrate of the transistor. The coefficient A is then supplied by the rapport between this equivalent capacity and the injection duration.

Figure 7:
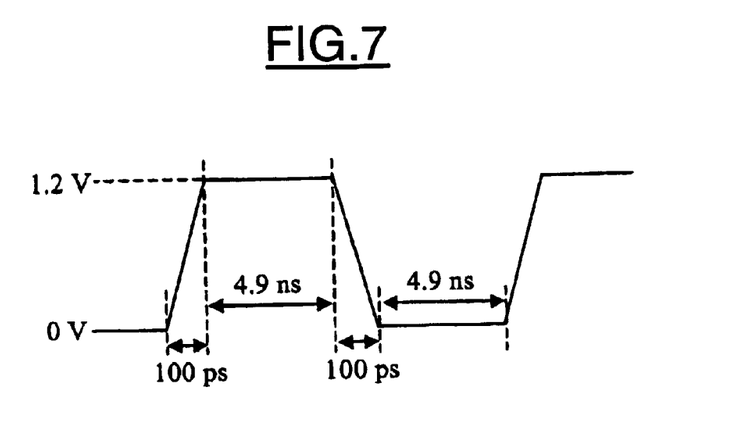
Figure 8:
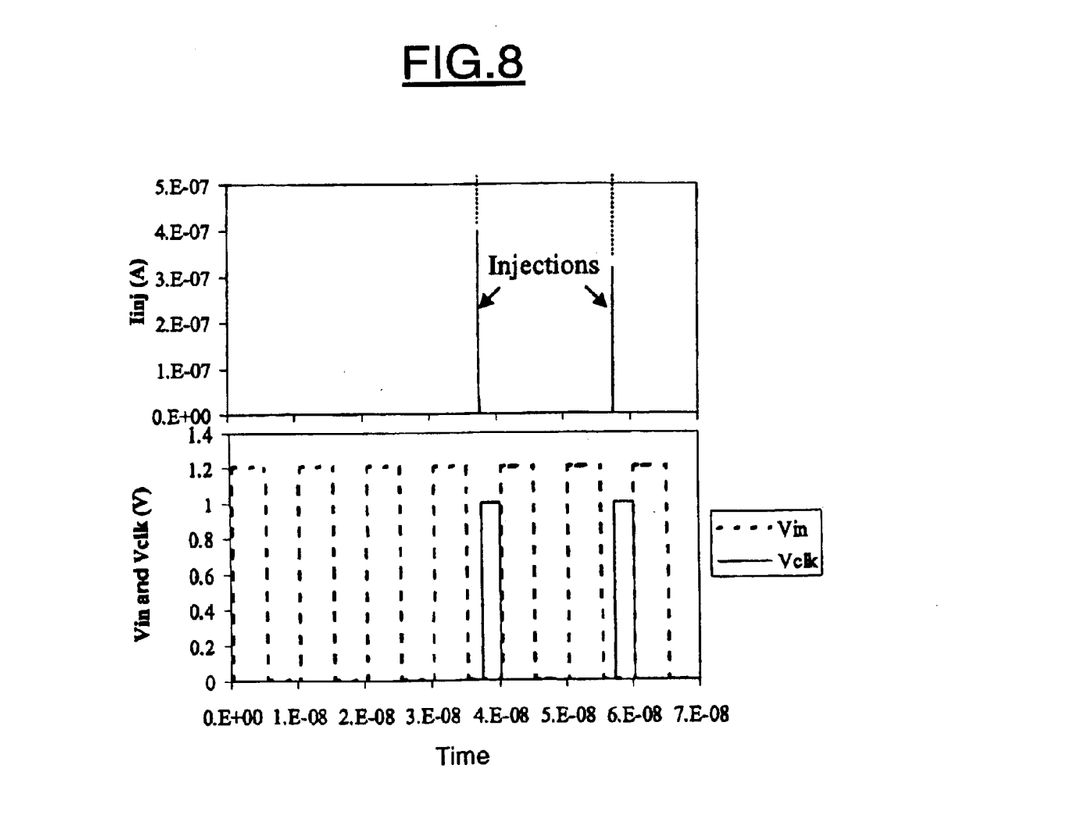
Figure 9:
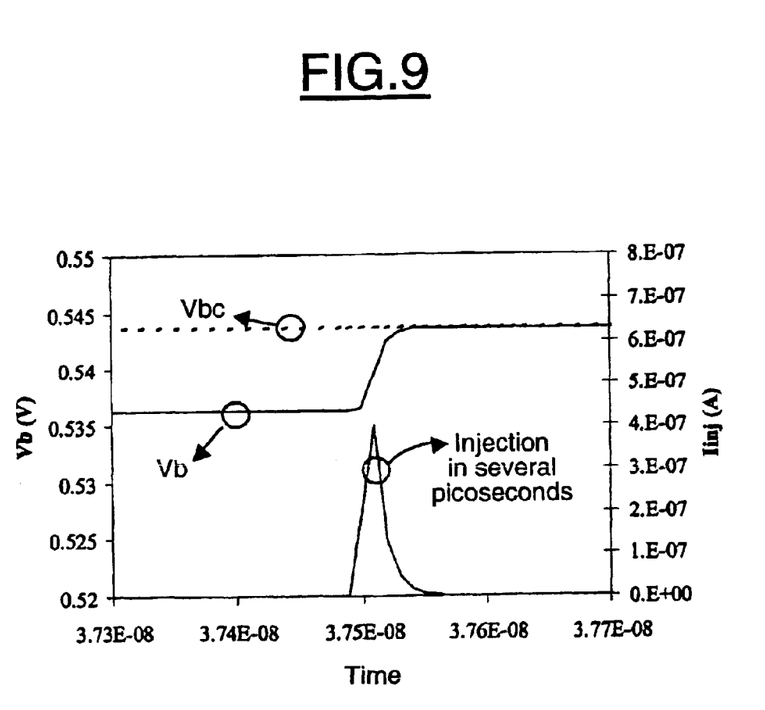

Thus, with a stimulation signal such as that illustrated in FIGS. 7 and 8 (in FIG. 8 Vin is the input voltage corresponding to the stimulation signal) and a clock signal Vclk such as that illustrated in FIG. 8, it is observed in FIG. 9 that an injection in a few picoseconds allows the current internal potential of the transistor Vb to rejoin the potential target Vbc during the period of injection. It will be noted in this example that the injection begins after four cycles of the stimulation signal.

Therefore, with an acceleration factor of 1000, the state of dynamic equilibrium can be achieved for a simple inverter in 3 minutes 15 seconds corresponding to 400 simulated pulses, corresponding to 398,000 real pulses. By way of indication, an exhaustive classic method would have lead to the state of equilibrium on completion of 400,000 pulses in a period of 8 hours 40 minutes.

The invention then allows the evolution of the internal potentials of the cell corresponding to the rising transitions of the stimulation signal to be determined. For this, the Eldo simulator will be used to calculate the values of the internal potentials just before a rising transition. This can also be done for falling transitions. In addition, the two initial values of the stimulation signal are determined.

During simulation, the evolution of other parameters, such as the time delays or consumption, which are supplied by the Eldo software, can also be tracked. All these evolutions of these parameters allow the best case and/or the worst case for these parameters to be determined, in particular the worst cases or best cases of time delays.

The invention also applies to characterization of the most complex cells. Thus, in the case of a NAND device with two inputs, whereas the state of dynamic equilibrium is not always achieved with classic simulation on completion of 400,000 pulses of the stimulation signal, the equivalent of 49 million pulses has been simulated with the acceleration process according to the present invention in less than three minutes, corresponding to 160 simulated pulses.

Figure 10:
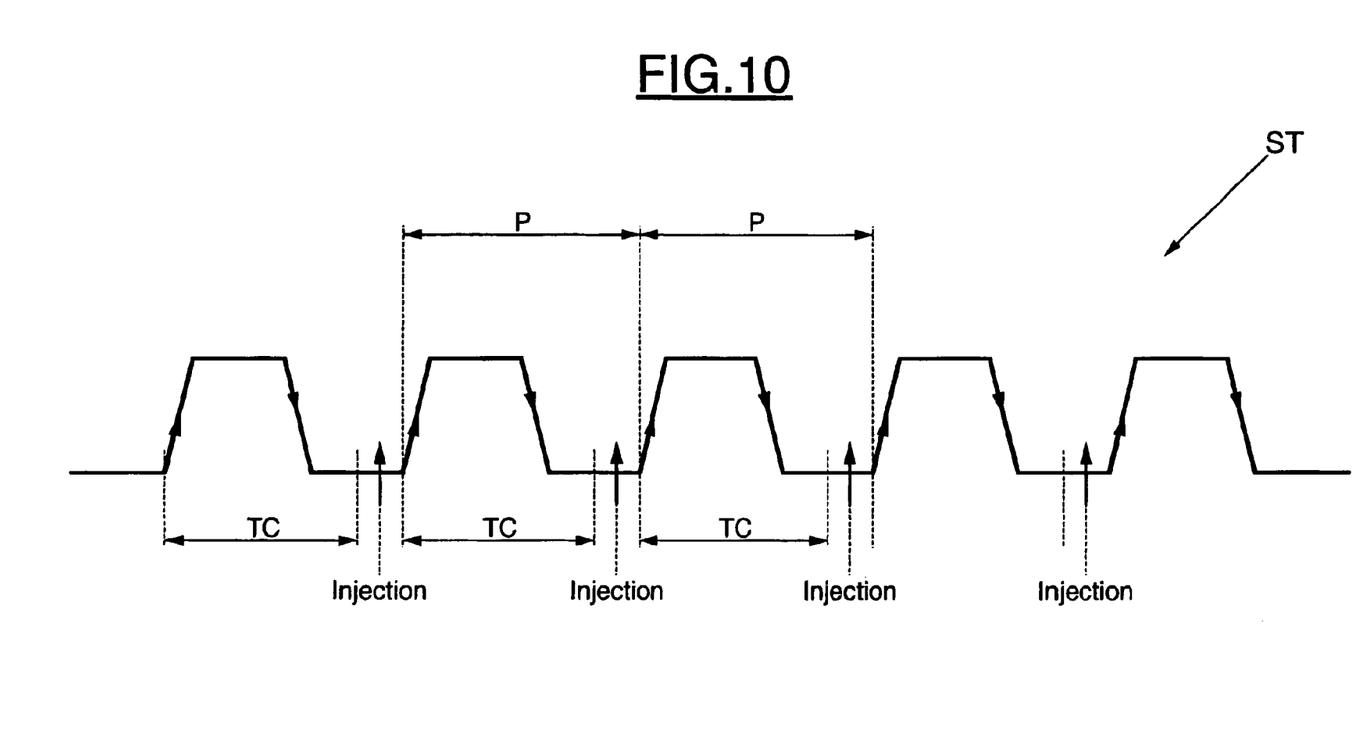
FIG. 10 is a diagram illustrating a second embodiment of a process according to the present invention, in which the process includes injections at each cycle of the stimulation signal.

The invention is not limited to the methods and embodiments which have just been described hereinabove, but include all variants thereof. Thus, as illustrated in FIG. 10, it is feasible to perform an injection at injection instants separated by a period of the stimulation signal. These injection instants could be in the second half of the low plateau of each period of the stimulation signal and the time interval TC for calculating the variation of the internal potential would then be between the beginning of a period of the stimulation signal and the first half of the low plateau.

What is claimed is:

1. A method for evaluating a CMOS logic cell manufactured in partially depleted silicon-on-insulation (PD-SOI) technology, the logic cell including transistors having a floating substrate, the method comprising:
   modeling the logic cell; and
   determining internal potentials of the logic cell by
      utilizing a stimulation signal in an operational simulation of the modeled logic cell, and
      injecting the floating substrate of each transistor, at predetermined successive instants of injection, with a charge proportional to a variation of an internal potential of the corresponding transistor determined during a predetermined time interval of the stimulation signal preceding a current instant of injection.

2. A method as claimed in claim 1, wherein an injection current corresponding to the injected charge is determined such that, after injection, the variation of the internal potential of the corresponding transistor reaches n times a measured variation of the internal potential.

3. A method as claimed in claim 2, wherein the value of n is determined by measuring the variation of the internal potential of a transistor of the cell, during a cycle of the stimulation signal, and from an estimated amplitude of the variation of the internal potential of this transistor between a static equilibrium state and a dynamic equilibrium state.

4. A method as claimed in claim 1, wherein the charge proportional to the variation of the internal potential of the corresponding transistor is determined using a proportionality coefficient having a value determined by measuring the variation of the internal potential and by the charge variation of a transistor of the logic cell during a cycle of the stimulation signal, and of a duration of injection.

5. A method as claimed in claim 1, wherein the stimulation signal comprises, in each period, a transition separating two plateaus, with an injection instant being located during a plateau and at a transition distance, and wherein the duration of injection of the current is selected to be greater than a time of the operational simulation and less than a duration of the plateau.

6. A method as claimed in claim 1, wherein consecutive injection instants are spaced at an interval equal to two periods of the stimulation signal, and wherein the time interval has a duration equal to a period of the stimulation signal.

7. A method as claimed in claim 6, wherein an initial instant of the time interval precedes the injection instant of 1.5 periods of the stimulation signal, and a final instant of the time interval precedes the injection instant of 0.5 period of the stimulation signal.

8. A method as claimed in claim 1, wherein the operational simulation of each transistor of the logic cell comprises modeling the transistor connected to three voltage-controlled modeled voltage sources to allow an internal potential target of the transistor to be reached to be determined after injection, and connected to a modeled current source supplying an injection current proportional to a difference between the internal potential target and an internal potential at an injection instant.

9. A method as claimed in claim 8, wherein a first voltage source supplies at the injection instant the value of the internal potential of the transistor delayed by a period of the stimulation signal, and the second voltage source supplies the variation of the internal potential over a period, delayed by a half period of the stimulation signal, and a third voltage source supplies the internal potential target.

10. A method as claimed in claim 1, wherein an evolution of the internal potentials of the transistors of the cell are determined from a static equilibrium state to a dynamic equilibrium state, relative to rising and falling transitions of the stimulation signal and for two initial values of the stimulation signal, and wherein the internal potentials of the transistors corresponding to the minimum and the maximum time delay of the cell are deduced therefrom.

11. A method as claimed in claim 1, further comprising:
determining an evolution of different time delays of the logic cell; and
determining minimum and maximum time delays.

12. A method as claimed in claim 1, further comprising:
determining an evolution of logic cell power consumption; and
determining minimum and maximum power consumption.

13. A device for evaluating a CMOS logic cell manufactured in partially depleted silicon-on-insulation (PD-SOI) technology, the logic cell including transistors having a floating substrate, the device comprising:
modeling means for modeling the cell; and
processing means for determining internal potentials of the logic cell based on operational simulation of the modeled cell using a periodic stimulation signal, and for injecting the floating substrate of each transistor of the cell, at predetermined successive instants of injection, with a charge proportional to a variation of the internal potential of the corresponding transistor determined during a predetermined time interval of the stimulation signal preceding the current injection instant to accelerate one of the charge and discharge of the floating substrate of the transistor.

14. A device as claimed in claim 13, wherein the processing means determines an injection current corresponding to the injected charge such that after injection the variation of the internal potential of the corresponding transistor reaches n times a measured variation of the internal potential.

15. A device as claimed in claim 14, wherein the processing means determines the value of n by measuring the variation of the internal potential of a transistor of the cell in a cycle of the stimulation signal and by an estimated amplitude of the variation of the internal potential of the transistor between a static equilibrium state and a dynamic equilibrium state.

16. A device as claimed in claim 13, wherein the processing means determines a proportionality coefficient by measuring the variation of the internal potential and from the charge variation of the transistor of the cell during a cycle of the stimulation signal, and of the injection duration.

17. A device as claimed in claim 13, wherein the stimulation signal comprises, in each period, a transition separating two plateaus, and wherein an injection instant takes place during a plateau at a transition distance, and the duration of injection of the current is selected to be greater than the time pitch of the operational simulation and less than the duration of a plateau.

18. A device as claimed in claim 13, wherein two consecutive injection instants are spaced by a period equal to two periods of the stimulation signal, and in the time interval has duration equal to a period of the stimulation signal.

19. A device as claimed in claim 18, wherein an initial instant of the time interval precedes the injection instant by 1.5 periods of the stimulation signal, at a final instant of the time interval precedes the instant of injection by 0.5 period of the stimulation signal.

20. A device as claimed in claim 13, wherein the modeling means comprises, for each transistor of the cell:
three modeled voltage-controlled voltage sources connected to the transistor, to allow an internal potential target of the transistor to be reached to be determined after injection; and
a modeled current source connected to the transistor to supply an injection current proportional to a difference between the internal potential target and the internal potential at the instant of injection.

21. A device as claimed in claim 20, wherein a first voltage source supplies the injection instant, the value of the internal potential of the transistor delayed by a period of the stimulation signal, wherein a second voltage source supplies the variation of the internal potential over a period, delayed by a period of the stimulation signal, and wherein a third voltage source supplies the internal potential target.

22. A device as claimed in claim 13, wherein the processing means determines an evolution of the internal potentials of the transistors of the logic cell from a static equilibrium state to a dynamic equilibrium state, relative to rising and falling transitions of the stimulation signal and for two initial values of the stimulation signal, to deduce minimum and maximum internal potentials of the transistors.

23. A device as claimed in claim 22, wherein the processing means determines an evolution of different time delays of the cell, and determines minimum and maximum time delays.

24. A device as claimed in claim 23, wherein the processing means determines an evolution of power consumption of the logic cell, and determines minimum and maximum power consumption.

25. A device for evaluating a CMOS logic cell manufactured in partially depleted silicon-on-insulation (PD-SOI) technology, the logic cell including transistors having a floating substrate, the device comprising:
a modeling unit to model the cell; and
a processor to determine internal potentials of the logic cell based on operational simulation of the modeled cell using a periodic stimulation signal, and to inject the floating substrate of each transistor of the cell, at predetermined successive instants of injection, with a charge proportional to a variation of the internal potential of the corresponding transistor determined during a predetermined time interval of the stimulation signal preceding the current injection instant to accelerate one of the charge and discharge of the floating substrate of the transistor.

26. A device as claimed in claim 25, wherein the processor determines an injection current corresponding to the injected charge such that after injection the variation of the internal potential of the corresponding transistor reaches n times a measured variation of the internal potential.

27. A device as claimed in claim 26, wherein the processor determines the value of n by measuring the variation of the internal potential of a transistor of the cell in a cycle of the stimulation signal and by an estimated amplitude of the variation of the internal potential of the transistor between a static equilibrium state and a dynamic equilibrium state.

28. A device as claimed in claim 25, wherein the processor determines a proportionality coefficient by measuring the variation of the internal potential and from the charge variation of the transistor of the cell during a cycle of the stimulation signal, and of the injection duration.

29. A device as claimed in claim 25, wherein the modeling unit comprises, for each transistor of the cell:

three modeled voltage-controlled voltage sources connected to the transistor, to allow an internal potential target of the transistor to be reached to be determined after injection; and a modeled current source connected to the transistor to supply an injection current proportional to a difference between the internal potential target and the internal potential at the instant of injection.

* * * * *

UNITED STATES PATENT AND TRADEMARK OFFICE
CERTIFICATE OF CORRECTION

PATENT NO. : 6,779,161 B1
DATED : August 17, 2004
INVENTOR(S) : Poiroux et al.

It is certified that error appears in the above-identified patent and that said Letters Patent is hereby corrected as shown below:

Title page,
Item [73], Assignee, delete "Commissariat a l' Energie" insert -- Commissariat A L' Energie --
Item [75], Inventors, delete "Phillipe" insert -- Philippe --
Item [56], References Cited, OTHER PUBLICATIONS, "Shepherd, K. et al." reference, delete "ananlysis" insert -- analysis --

Signed and Sealed this

Twenty-eighth Day of June, 2005

JON W. DUDAS
*Director of the United States Patent and Trademark Office*